United States Patent [19]
Williamson

[11] Patent Number: 5,815,310
[45] Date of Patent: Sep. 29, 1998

[54] HIGH NUMERICAL APERTURE RING FIELD OPTICAL REDUCTION SYSTEM

[75] Inventor: David M. Williamson, West Malvern, United Kingdom

[73] Assignee: SVG Lithography Systems, Inc., Wilton, Conn.

[21] Appl. No.: 571,081

[22] Filed: Dec. 12, 1995

[51] Int. Cl.$^6$ .......................... G02B 17/00; G02B 21/00; G02B 23/00; G02B 5/10
[52] U.S. Cl. .......................... 359/365; 359/730; 359/858
[58] Field of Search .................. 359/365, 366, 359/729, 858, 859, 730, 731

[56] References Cited

U.S. PATENT DOCUMENTS

| | | | |
|---|---|---|---|
| 4,226,501 | 10/1980 | Shafer | 359/366 |
| 4,241,390 | 12/1980 | Markle et al. | 362/299 |
| 4,701,035 | 10/1987 | Hirose | 359/366 |
| 4,747,678 | 5/1988 | Shafer et al. | 359/366 |
| 5,063,586 | 11/1991 | Jewell et al. | 378/34 |
| 5,153,898 | 10/1992 | Suzuki et al. | 378/34 |
| 5,315,629 | 5/1994 | Jewell et al. | 378/34 |

OTHER PUBLICATIONS

Jewell et al, Reflective Systems Design Study For Soft X–Ray Projection Lithography, Aug. 3, 1990, J. Vac. Sci. Technol B8(6), Nov./Dec. 1990;1990 American Vaccum Society; pp. 1519 to 1523.

*Primary Examiner*—Thong Nguyen
*Assistant Examiner*—Mark A. Robinson
*Attorney, Agent, or Firm*—Paul A. Fattibene; Arthur T. Fattibene; Fattibene & Fattibene

[57] ABSTRACT

An optical projection reduction system used in photolithography for the manufacture of semiconductor devices having a first mirror pair, a second field mirror pair, and a third mirror pair. Electromagnetic radiation from a reticle or mask is reflected by a first mirror pair to a second field mirror pair forming an intermediate image. A third mirror pair re-images the intermediate image to an image plane at a wafer. All six mirrors are spherical or aspheric and rotationally symmetrical about an optical axis. An annular ring field is obtained, a portion of which may be used in a step and scan photolithography system. In another embodiment, weak refracting elements are introduced to further reduce residual aberrations allowing a higher numerical aperture. In the catoptric embodiment of the present invention, a numerical aperture of 0.25 is obtained resulting in a working resolution of 0.03 microns with electromagnetic radiation having a wavelength of 13 nanometers. The optical projection reduction systems are intended for use at extreme ultraviolet to the soft X-ray wavelength range. The present invention, provides a relatively high numerical aperture and uses substantially all reflective elements, greatly facilitating the manufacture of semiconductor devices having feature sizes below 0.25 microns.

18 Claims, 3 Drawing Sheets

HIGH NUMERICAL APERTURE RING FIELD OPTICAL REDUCTION SYSTEM

FIELD OF THE INVENTION

This invention relates generally to projection lithography, and more particularly to a catoptric and catadioptric optical system for use with short wavelengths in the near and extreme ultraviolet or soft X-ray region.

BACKGROUND OF THE INVENTION

In the manufacture of semiconductor devices, photolithography is often used. Projection optics are used to image a mask or reticle onto a wafer. Optical systems using refractive elements have achieved resolutions approaching 0.25 micrometers operating with illumination sources having wavelengths of 248 or 193 nanometers. As the element or feature size of semiconductor devices become smaller, the need for optical projection systems capable of providing a resolution less than 0.25 micrometers are needed. In order to decrease the feature size which the optical projection systems used in photolithography can resolve, shorter wavelengths of electromagnetic radiation must be used to project the image of a reticle or mask onto a photosensitive substrate, such as a semiconductor wafer. Because very few refractive optical materials are able to transmit significant electromagnetic radiation below a wavelength of 193 nanometers, it is necessary to reduce to a minimum or eliminate refractive elements in optical projection systems operating at wavelengths below 193 nanometers. An optical system that is usable in the deep ultraviolet portion of the spectrum is disclosed in U.S. Pat. No. 4,747,678 entitled "Optical Relay System With Magnification" issuing to Shafer, et al, on May 31, 1988, which is herein incorporated by reference. However, the desire to resolve ever smaller features makes necessary optical projection systems that operate at the extreme ultraviolet wavelengths, below 200 nanometers, to the soft X-ray wavelengths, around 13 nanometers. While there are several optical projection systems that operate within this wavelength region, they are limited to a relatively low numerical aperture of less than 0.1 at the image or wafer. Increasing the numerical aperture of these designs will result in unacceptably large residual aberrations and obscuration of the light beams by the edges of the mirrors. While these projection optical systems perform adequately for their intended purpose, there is a need for optical projection systems having a higher numerical aperture for use at wavelengths in the extreme ultraviolet or soft x-ray wavelengths, or for resolutions substantially less than 0.1 micrometers or microns.

SUMMARY OF THE INVENTION

The present invention comprises three mirror pairs. The first mirror pair includes a positive power mirror imaging an entrance pupil onto a second mirror of the first mirror pair providing an accessible, real aperture stop. A second mirror pair receives electromagnetic radiation from the first mirror pair and includes a positive power mirror relaying the aperture stop to a second real pupil and forming an intermediate image. A third mirror pair receives electromagnetic radiation from the second mirror pair, and includes a positive power mirror relaying the second real pupil to an exit pupil at infinity and imaging the intermediate image to a real final image. A six mirror reduction system of relatively high numerical aperture is thereby obtained that provides a reduced image of an object, such as a reticle or mask, onto a photosensitive substrate, such as a semiconductor wafer. The second mirror pair acts as a field mirror element providing a relatively high numerical aperture with good or acceptable image quality. All six mirrors may be aspheric to obtain the smallest possible residual aberrations.

Accordingly, it is an object of the present invention to provide a projection optical system for use with wavelengths lower than approximately 200 nanometers and having a relatively high numerical aperture.

It is a further object of the present invention to increase resolution permitting imaging of small element features as required in semiconductor manufacture.

It is an advantage of the present invention that the object and image are accessible for parallel scanning of a reticle and wafer stage as used in step and scan photolithography.

It is another advantage of the present invention that a relatively large field is obtained.

It is a feature of the present invention that an aperture stop is accessible.

It is a further feature of the present invention that a field mirror element is used.

These and other objects, advantages, and features will become readily apparent in view of the following detailed description.

DETAILED DESCRIPTION OF THE PREFERRED EMBODIMENTS

Figure 1:
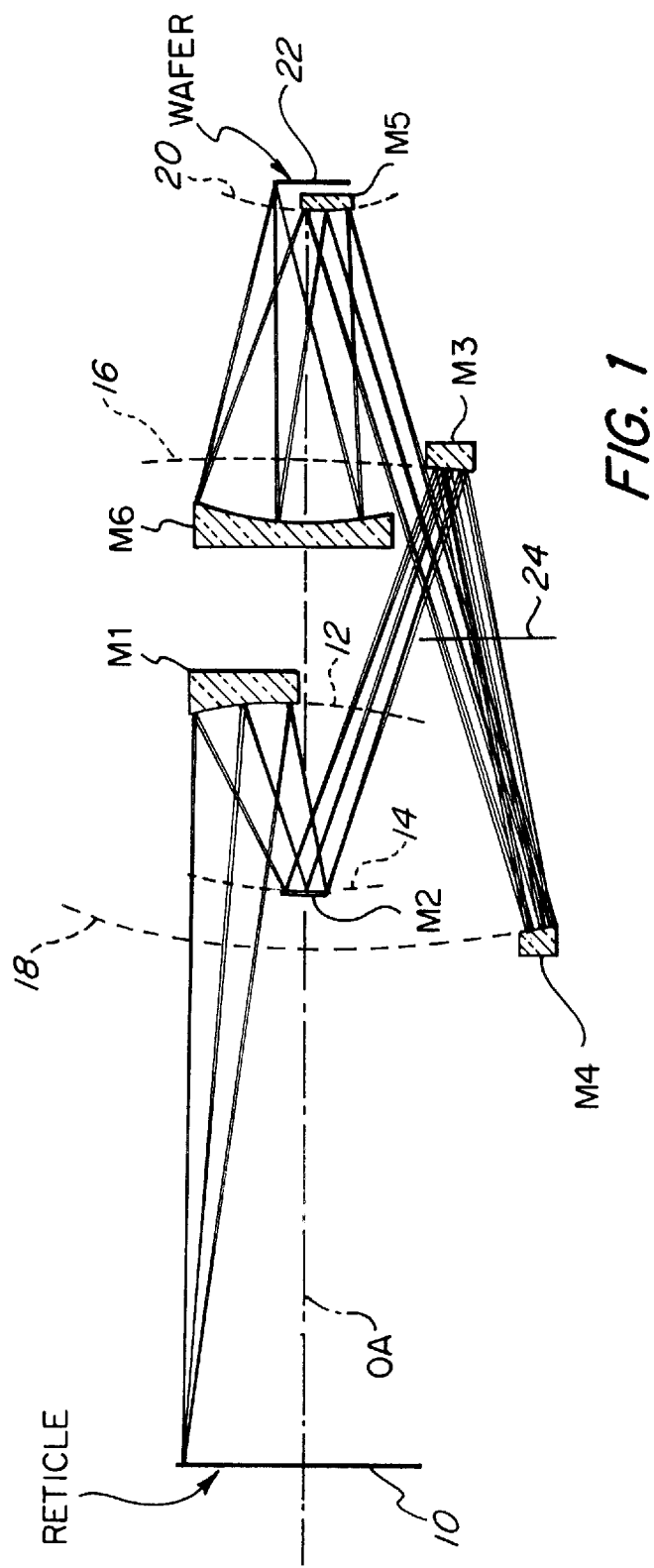
FIG. 1 is a schematic illustration of one embodiment of the present invention.

FIG. 1 schematically illustrates a first embodiment of the present invention. The light from a reticle or mask 10 is collected by concave mirror M1. Dashed line 12 represents the extended curvature of mirror M1. Mirror M1 reflects electromagnetic radiation to concave mirror M2. An aperture stop 14 is positioned at or near mirror M2. An entrance pupil is positioned a finite distance from the reticle or mask 10 and imaged at mirror M2 by mirror M1. Electromagnetic radiation is reflected from mirror M2 to concave mirror M3. Dashed line 16 illustrates the extended curvature of concave mirror M3. Electromagnetic radiation from mirror M3 is received and reflected by concave mirror M4. Dashed line 18 illustrates the extended curvature of concave mirror M4. Electromagnetic radiation is reflected from mirror M4 and received by convex mirror M5. Dashed line 20 illustrates the extended curvature of convex mirror M5. Electromagnetic radiation is reflected from mirror M5 and received by concave mirror M6, and reflected by concave mirror M6 to an image location at a wafer 22. All of the mirrors M1–M6 are substantially rotationally symmetric about the optical axis OA. An intermediate image 24 is formed between the mirrors M4 and M3 or at an off-axis location between the first mirror pair, M1 and M2, and the third mirror pair, M5 and M6. This intermediate image is re-imaged at the wafer 22 by mirrors M4, M5, and M6. The first mirror pair, M1 and M2, reflects electromagnetic radiation to a second mirror pair, M3 and M4. The second mirror pair, M3 and M4, functions as a field mirror element and takes the chief ray leaving mirror M2 diverging away from the optical axis OA, and converts it to a chief ray converging toward the optical axis OA for acceptance by a third mirror pair, M5 and M6.

Accordingly, a field mirror element may be a mirror pair that converts a chief ray diverging away from the optical axis OA to a chief ray converging towards the optical axis OA. In this first embodiment the residual aberrations are small enough to permit use at a wavelength of approximately 13 nanometers. The numerical aperture in the image space near the wafer 22 in this first embodiment is approximately 0.25. This provides a working resolution of 0.03 micrometers or microns. An annular image field having a radius between 29 and 31 millimeters from the optical axis OA has aberrations, including distortions small enough for use in a step and scan photolithography system with a scanned field size of 30 millimeters in the cross scan direction. In this first embodiment, a four to one reduction is obtained. Mirrors M1–M6 may be spherical or aspheric and fabricated by any conventional means, including the placement of coatings thereon such as disclosed in U.S. Pat. No. 5,153,898 entitled "X-Ray Reduction Projection Exposure System of Reflection Type" issuing to Fukuda et al on Oct. 6, 1992, which is herein incorporated by reference. Aspheric mirrors may be used to obtain the smallest possible residual aberrations.

The construction data for the optical system illustrated in FIG. 1 according to the present invention is given in Table 1 below.

TABLE 1

| Element Number | Radius of Curvature | | Thickness | Aperture Diameter | | Glass |
|---|---|---|---|---|---|---|
| | Front | Back | | Front | Back | |
| object | Infinity | | 571.0624 | | | |
| | | | | 236.9146 | | |
| | | | 192.0526 | | | |
| 1 | A(1) | | −192.0526 | 233.4582 | | Refl |
| | | | Aperture Stop | 46.3098 | | |
| | | | 0.0000 | | | |
| 2 | A(2) | | 0.0000 | 45.7172 | | Refl |
| | | | | 45.2145 | | |
| | | | 432.1152 | | | |
| 3 | A(3) | | −490.5496 | 334.0156 | | Refl |
| 4 | A(4) | | 490.5496 | 503.2223 | | Refl |
| | | | | 240.0123 | | |
| | | | −62.8918 | | | |
| | | | | 261.2488 | | |
| | | | 320.6990 | | | |
| 5 | A(5) | | −320.6990 | 86.6738 | | Refl |
| 6 | A(6) | | 320.6990 | 227.7070 | | Refl |
| | | | | 72.1652 | | |
| Image | Image Distance = INF | | 22.3092 | 62.0000 | | |

In the above table, positive radius indicates the center of curvature is to the right, negative radius indicates the center of curvature is to the left, dimensions are given in millimeters, thickness is axial distance to next surface, and the image diameter shown above is a paraxial value and is not a ray traced value.

Additionally, aspheric constants are given by the equation and Table 1A below.

$$Z = \frac{(CURV)Y^2}{1 + (1 - (1+K)(CURV)^2 Y^2)^{1/2}} + (A)Y^4 + (B)Y^6 + (C)Y^8 + (D)Y^{10}$$

TABLE 1A

| Aspheric | Curv | K | A | B | C | D |
|---|---|---|---|---|---|---|
| A(1) | −0.00204178 | 0.000000 | 6.26871E − 10 | −1.09535E − 15 | 1.29067E − 20 | 8.68980E − 26 |
| A(2) | −0.00248086 | 0.000000 | 1.05970E − 08 | 4.81436E − 13 | −1.10750E − 15 | 7.52743E − 19 |
| A(3) | −0.00048280 | 0.000000 | 2.18257E − 11 | 2.87915E − 15 | 6.04832E − 20 | 3.68423E − 25 |
| A(4) | 0.00101457 | 0.000000 | 3.42885E − 11 | −4.85608E − 16 | −3.57675E − 22 | 1.81445E − 26 |
| A(5) | 0.00355137 | 0.000000 | 1.77414E − 08 | 1.15815E − 12 | 7.13212E − 17 | −4.35391E − 21 |
| A(6) | 0.00258825 | 0.000000 | 1.36198E − 10 | 1.22849E − 15 | 8.27928E − 21 | 1.16903E − 25 |

Figure 2:
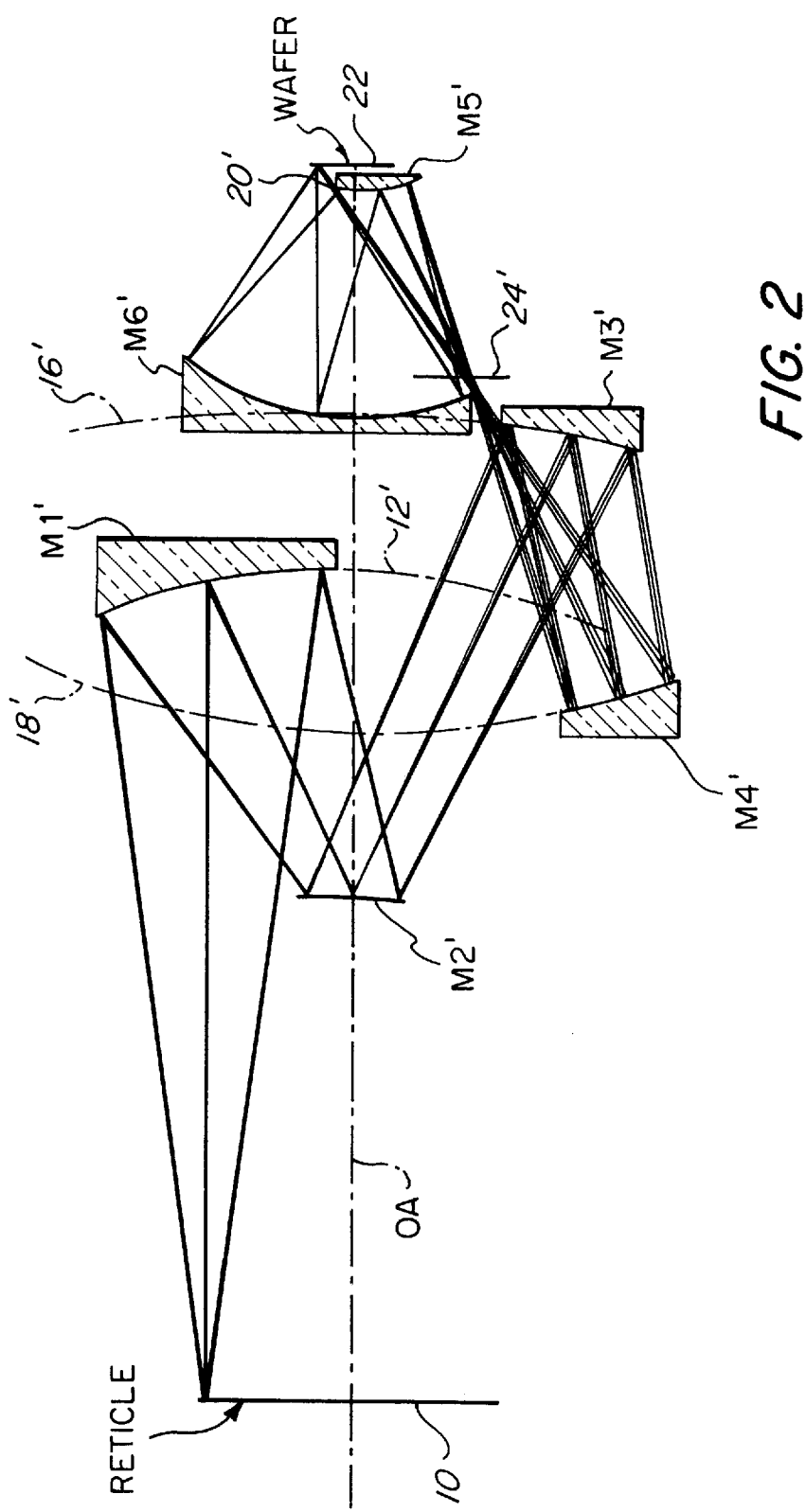
FIG. 2 is a schematic illustration of a second embodiment of the present invention.

FIG. 2 illustrates a second embodiment of the present invention. In this embodiment, the entrance pupil is at infinity, resulting in the system being telecentric at the reticle 10. Electromagnetic radiation from the reticle 10 is collected by concave mirror M1' and reflected to convex mirror M2'. Dashed line 12' represents the extended curvature of mirror M1'. Mirrors M1' and M2' form a first mirror pair. Electromagnetic radiation reflected from convex mirror M2' is collected by concave mirror M3'. Dashed line 16' represents the extended curvature of mirror M3'. Electromagnetic radiation is reflected from mirror M3' to concave mirror M4'. Dashed line 18' represents the extended curvature of mirror M4'. Mirrors M3' and M4' form a second mirror pair acting as a field mirror element. Electromagnetic radiation is reflected from mirror M4' and is collected by convex mirror M5'. Dashed line 20' represents the extended curvature of mirror M5'. Electromagnetic radiation is reflected from mirror M5' and collected by mirror M6'. Mirrors M5' and M6' form a third mirror pair. The electromagnetic radiation reflected from the concave mirror M6' is imaged at a wafer 22. All of the mirrors M1'–M6' are rotationally symmetrical about the optical axis OA. The field mirror element mirror pair M4' and M3' form an intermediate image plane 24' after mirror M4' and close to mirror M6' or at an off-axis location between the mirrors of the third mirror pair M5' and M6'. This is advantageous at high numerical apertures to minimize the electromagnetic radiation beam size that has to clear the edge of mirror M6'. The third mirror pair, mirrors M5' and M6', re-image the image at the intermediate image plane 24' to a final image at the wafer 22. In this second embodiment the image space is telecentric, that is the exit pupil is at infinity. This second embodiment has a four to one reduction ratio, and the numerical aperture into the image space near the wafer 22 is 0.55. At this relatively high numerical aperture, the residual aberrations are small enough that the optical projection system may be used at wavelengths of approximately 193 nanometers. This allowing a working resolution of 0.25 microns or micrometers. An annular field formed between a radius of 29.5 and 30.5 millimeters from the optical axis OA at the wafer 22 is sufficient for use in a step and scan lithography system with a field size of 30 millimeters in the cross-scan direction.

The construction data for the optical system illustrated in FIG. 2 according to the present invention is given in Table 2 below.

TABLE 2

| Element Number | Radius of Curvature Front | Radius of Curvature Back | Thickness | Aperture Diameter Front | Aperture Diameter Back | Glass |
|---|---|---|---|---|---|---|
| object | Infinity | | 407.8161 | | 357.5906 | |
| 1 | A(1) | | 264.5379 −264.5379 Aperture Stop 0.0000 | 419.5247 77.5026 | | Refl |
| 2 | A(2) | | 0.0000 390.2371 | 74.9379 77.3224 | | Refl |
| 3 | A(3) | | −260.0000 | 467.2174 | | Refl |
| 4 | A(4) | | 260.0000 −5.6992 186.2863 | 527.2466 240.4502 206.6446 | | Refl |
| 5 | A(5) | | −186.2863 | 92.0895 | | Refl |
| 6 | A(6) | | 186.2863 | 272.0463 82.3061 | | Refl |
| Image | Image Distance = INF | | 20.0000 | | 60.9996 | |

In the above table, positive radius indicates the center of curvature is to the right, negative radius indicates the center of curvature is to the left, dimensions are given in millimeters, thickness is axial distance to next surface, and the image diameter shown above is a paraxial value and is not a ray traced value.

Additionally, aspheric constants are given by the equation and Table 2A below.

$$Z = \frac{(CURV)Y^2}{1 + (1 - (1+K)(CURV)^2 Y^2)^{1/2}} + (A)Y^4 + (B)Y^6 + (C)Y^8 + (D)Y^{10} + (E)Y^{12} + (F)Y^{14} + (G)Y^{16} + (H)Y^{18} + (J)Y^{20}$$

TABLE 2A

| Aspheric | Curv | K E | A F | B G | C H | D J |
|---|---|---|---|---|---|---|
| A(1) | −0.00184131 | 0.000000 0.00000E + 00 | 2.24506E − 12 0.00000E + 00 | −1.06529E − 15 0.00000E + 00 | 1.40153E − 20 0.00000E + 00 | −1.45525E − 26 0.00000E + 00 |
| A(2) | −0.00344767 | 0.000000 3.43046E − 23 | 2.70239E − 08 0.00000E + 00 | 6.29102E − 12 0.00000E + 00 | 1.39941E − 15 0.00000E + 00 | −1.11823E − 19 0.00000E + 00 |
| A(3) | −0.00073996 | 0.000000 0.00000E + 00 | 3.47651E − 10 0.00000E + 00 | 1.86467E − 16 0.00000E + 00 | −3.27086E − 20 0.00000E + 00 | 1.15234E − 25 0.00000E + 00 |
| A(4) | 0.00145483 | 0.000000 0.00000E + 00 | −6.10242E − 11 0.00000E + 00 | 7.82453E − 16 0.00000E + 00 | −8.98158E − 21 0.00000E + 00 | −4.15911E − 26 0.00000E + 00 |
| A(5) | 0.00444460 | 0.000000 6.03283E − 23 | 1.67615E − 07 0.00000E + 00 | 1.75232E − 11 0.00000E + 00 | 8.40253E − 16 0.00000E + 00 | 8.38291E − 20 0.00000E + 00 |
| A(6) | 0.00442274 | 0.000000 5.15810E − 28 | 5.24492E − 10 0.00000E + 00 | 8.43072E − 15 0.00000E + 00 | 4.12933E − 19 0.00000E + 00 | −9.76520E − 24 0.00000E + 00 |

Figure 3:
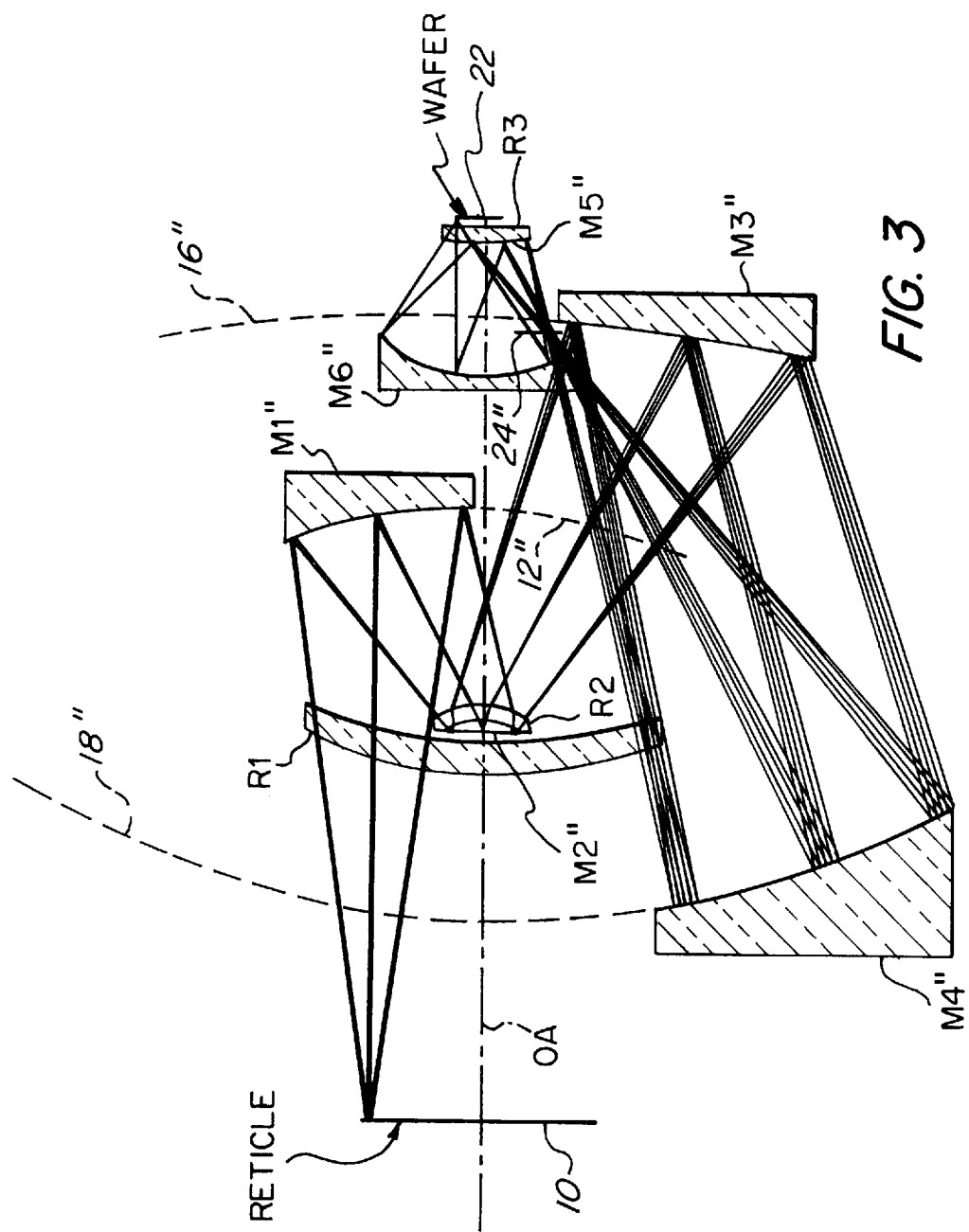
FIG. 3 is a schematic illustration of a third embodiment of the present invention.

FIG. 3 illustrates a third embodiment of the present invention. This third embodiment illustrates a catadioptric system. Electromagnetic radiation from the reticle 10 is refracted by a first lens element R1. The electromagnetic radiation is then collected by concave mirror M1" and reflected, to a second lens element R2. Lens element R2 is near or adjacent convex mirror M2". Mirrors M1" and M2" form a first mirror pair. Dashed line 12" represents the extended curvature of mirror M1". Electromagnetic radiation is reflected from mirror M2" and collected by mirror M3". Dashed line 16" represents the curvature of concave mirror M3". Electromagnetic radiation is reflected from mirror M3" and collected by concave mirror M4". Dashed line 18" represents the curvature of mirror M4". Mirrors M3" and M4" form a second mirror pair. Electromagnetic radiation reflected from mirror M4" is collected by convex mirror M5". Electromagnetic radiation reflected from mirror M5" is collected by concave mirror M6". Mirrors M5" and M6" form a third mirror pair. Electromagnetic radiation reflected from mirror M6" is directed to a lens element R3 and is then imaged at an image plane at wafer 22. The second mirror pair, mirrors M3" and M4", form a field mirror element providing an intermediate image plane 24" between mirrors M6" and M3". The third mirror pair M5" and M6" re-image intermediate image plane 24" at the wafer 22. All of the mirrors M1"–M6" and the refractive lens elements R1–R3 are rotationally symmetrical about the optical axis OA. The lens elements R1–R3 are refracting elements that reduce residual aberrations allowing operation at a higher numerical aperture in the image space near the wafer 22. In this third embodiment the numerical aperture at the image space near the wafer 22 is 0.6. An annular field having a radius between 29 and 31 millimeters from the optical axis OA is formed that may comfortably resolve 0.225 micron features using electromagnetic radiation at a wavelength of 193 nanometers. In this third embodiment 0.18 micron feature sizes may be achievable with the appropriate reticles, illumination conditions, and photo resist. An advantage of this third catadioptric embodiment is that the first lens element R1 may also serve as a sealing window if desired. This is desirable when the system is used in a purged environment. Lens element R1 may additionally be moved axially along the optical axis OA to make fine adjustments to system magnification. While the mirror M1" could be used for fine adjustments to magnification, mirror M1" is much more sensitive to alignment errors during axial movement. Lens element R3 may also be used as a sealing window. Additionally, lens element R3 may act as a substrate on which mirror M5" may be formed. The lens element R3 may have an aspheric second surface primarily to reduce residual distortion errors. This, the second surface of lens element R3, allows a wider annular field width to be used. Lens element R2 is primarily used to correct the chromatic variation of focus introduced by refractive lens elements R1 and R3. Chromatic variation of magnification is corrected by balancing the contributions of chromatic variations of magnification from lens elements R1 and R3. Chromatic correction is good enough in this embodiment to allow the use of an unnarrowed excimer laser source operating at 193 or 248 nanometers, or even a filtered mercury lamp operating at 248 nanometers. The optical projection system of this third embodiment is designed to operate at a four to one reduction ratio.

The construction data for the optical system illustrated in FIG. 3 according to the present invention is given in Table 3 below.

Accordingly, the present invention, by using three mirror pairs, with the second mirror pair being a field mirror element, greatly increases the numerical aperture possible in an optical projection reduction system for use with electromagnetic radiation at wavelengths below approximately 200

TABLE 3

| Element Number | Radius of Curvature | | Thickness | Aperature Diameter | | Glass |
|---|---|---|---|---|---|---|
| | Front | Back | | Front | Back | |
| Object | INF | | 363.7117 | | | |
| 1 | 528.5985 CX | 560.6353 CC | 30.0000 | 369.2458 | 367.0565 | 'silica' |
| | | | 20.0000 | | | |
| | | | | 364.0844 | | |
| | | | 229.7508 | | | |
| 2 | A(1) | | −209.7508 | 414.3396 | | Refl |
| 3 | −83.4955 CX | −75.5672 CC | −15.0000 | 97.0160 | 79.4269 | 'silica' |
| | | | −11.6150 | | | |
| | | | Aperture Stop | 72.1226 | | |
| 4 | A(2) | | 11.6150 | 72.1226 | | Refl |
| 5 | −75.5672 CC | −83.4955 CX | 15.0000 | 77.0143 | 93.4487 | 'silica' |
| | | | 407.8622 | | | |
| 6 | A(3) | | −635.1022 | 691.6152 | | Refl |
| 7 | A(4) | | 635.1022 | 1006.3416 | | Refl |
| | | | | 131.7841 | | |
| | | | −62.2903 | | | |
| | | | | 177.7085 | | |
| | | | 134.7903 | | | |
| 8 | A(5) | | −134.7903 | 89.6331 | | Refl |
| 9 | A(6) | | 134.7903 | 223.8931 | | Refl |
| 10 | A(7) | A(8) | 17.5000 | 88.9023 | 73.3478 | 'silica' |
| | Image Distance = | | 10.0000 | | | |
| IMAGE | INF | | | 62.0953 | | |

In the above table, positive radius indicates the center of curvature is to the right, negative radius indicates the center of curvature is to the left, dimensions are given in millimeters, thickness is axial distance to next surface, and the image diameter shown above is a paraxial value and is not a ray traced value.

Additionally, aspheric constants are given by the equation and Table 3A below.

$$Z = \frac{(CURV)Y^2}{1 + (1 - (1+K)(CURV)^2 Y^2)^{1/2}} + (A)Y^4 + (B)Y^6 + (C)Y^8 + (D)Y^{10} + (E)Y^{12} + (F)Y^{14} + (G)Y^{16} + (H)Y^{18} + (J)Y^{20}$$

nanometers. This greatly increases the field size as well as maintaining necessary resolution, permitting practical application for use in the manufacture of semiconductor devices having features smaller than 0.25 microns.

Additionally, although the preferred embodiment has been illustrated and described, it will be obvious to those skilled in the art that various modifications may be made without departing from the spirit and scope of this invention.

What is claimed is:

1. An optical reduction system for use in photolithography, from the long conjugate end to the short conjugate end, comprising:

a first mirror pair;

TABLE 3A

| Aspheric | Curv | K<br>E | A<br>F | B<br>G | C<br>H | D<br>J |
|---|---|---|---|---|---|---|
| A(1) | −0.00204511 | 0.000000<br>0.00000E + 00 | 2.33031E − 10<br>0.00000E + 00 | −2.45108E − 16<br>0.00000E + 00 | 1.19279E − 20<br>0.00000E + 00 | 7.03022E − 26<br>0.00000E + 00 |
| A(2) | −0.00552141 | 0.000000<br>−2.35686E − 22 | −3.13911E − 09<br>0.00000E + 00 | 5.79100E − 12<br>0.00000E + 00 | −7.42414E − 16<br>0.00000E + 00 | 1.18359E − 18<br>0.00000E + 00 |
| A(3) | −0.00053739 | 0.000000<br>0.00000E + 00 | 1.97475E − 10<br>0.00000E + 00 | −1.92949E − 16<br>0.00000E + 00 | −1.05508E − 21<br>0.00000E + 00 | 3.23255E − 27<br>0.00000E + 00 |
| A(4) | 0.00101984 | 0.000000<br>0.00000E + 00 | −1.51028E − 11<br>0.00000E + 00 | −2.24413E − 18<br>0.00000E + 00 | −3.43794E − 23<br>0.00000E + 00 | −1.20284E − 28<br>0.00000E + 00 |
| A(5) | 0.00387779 | 0.000000<br>2.19063E − 22 | 1.19897E − 07<br>−2.90311E − 26 | 1.63739E − 11<br>0.00000E + 00 | 1.80437E − 15<br>0.00000E + 00 | −5.45296E − 19<br>0.00000E + 00 |
| A(6) | 0.00571450 | 0.000000<br>−1.62403E − 26 | 2.26163E − 09<br>7.29705E − 31 | 8.71431E − 14<br>0.00000E + 00 | 5.66545E − 19<br>0.00000E + 00 | 3.51393E − 22<br>0.00000E + 00 |
| A(7) | 0.00387779 | 0.000000<br>2.19063E − 22 | 1.19897E − 07<br>−2.90311E − 26 | 1.63739E − 11<br>0.00000E + 00 | 1.80437E − 15<br>0.00000E + 00 | −5.46296E − 19<br>0.00000E + 00 |
| A(8) | 0.00280709 | 0.000000<br>0.00000E + 00 | −2.73857E − 08<br>0.00000E + 00 | 3.40519E − 10<br>0.00000E + 00 | −6.15022E − 14<br>0.00000E + 00 | −1.29049E − 17<br>0.00000E + 00 | a field mirror pair positioned to receive electromagnetic radiation reflected from said first mirror pair;

a third mirror pair positioned to receive electromagnetic radiation reflected from said field mirror pair;

a first refractive element positioned between an object and said first mirror pair;

a second refractive element positioned near a second mirror of said first mirror pair; and a third refractive element positioned between an image and said third mirror pairs, whereby an intermediate image is re-imaged to a final image at an image plane.

2. An optical reduction system as in claim 1 wherein:

said first refractive element is axially movable along an optical axis.

3. An optical reduction system as in claim 1 wherein:

chromatic variation of focus introduced by said first refractive element and said third refractive element is substantially corrected by said second refractive element.

4. An optical reduction system as in claim 1 wherein:

chromatic variation of magnification is substantially corrected by balancing contributions of chromatic variation of magnification from said first refractive element and said third refractive element.

5. An optical reduction system for use in photolithography, from the long conjugate end to the short conjugate end, comprising:

a first mirror pair;

a field mirror pair, said field mirror pair positioned to receive a chief ray reflected from said first mirror pair diverging away from an optical axis and converting it to a chief ray converging towards the optical axis; and a third mirror pair, said third mirror pair positioned to receive the chief ray reflected from said field mirror pair, wherein said first mirror pair, said field mirror pair, and said third mirror pair are positioned between a first plane formed by the long conjugate end and a second plane formed by the short conjugate end while progressing in a single direction along the optical axis, whereby a reduced image of an object is formed and the first plate and the second plane are accessible for parallel scanning.

6. An optical reduction system for use in photolithography, from the long conjugate end to the short conjugate end, comprising:

a first concave mirror;

a second mirror;

a third concave mirror;

a fourth concave mirror;

a fifth convex mirror; and a sixth concave mirror, wherein said first concave mirror, said second mirror, said third concave mirror, said fourth concave mirror, said fifth convex mirror, and said sixth concave mirror are all positioned between a first plane formed by the long conjugate end and a second plane formed by the short conjugate end while progressing in a single direction along an optical axis, whereby two of said first, second, third, fourth, fifth or sixth mirrors act as a field mirror pair.

7. An optical reduction system as in claim 6 wherein:

said second mirror is concave.

8. An optical reduction system as in claim 6 wherein:

said second mirror is convex.

9. An optical reduction system as in claim 6 wherein:

an aperture stop is formed near said second mirror.

10. An optical reduction system for use in photolithography, from the long conjugate end to the short conjugate end, comprising:

a first concave mirror;

a second mirror, positioned to receive reflected electromagnetic radiation from said first concave mirror;

a third concave mirror positioned to receive reflected electromagnetic radiation from said second mirror;

a fourth concave mirror positioned to receive reflected electromagnetic radiation from said third concave mirror;

a fifth convex mirror positioned to receive reflected electromagnetic radiation from said fourth concave mirror; and a sixth concave mirror positioned to receive reflected electromagnetic radiation from said fifth convex mirror, said first, second, third, fourth, fifth and sixth mirrors having an optical axis, said third concave mirror receiving a chief ray diverging away from the optical axis, and said fourth concave mirror receiving the chief ray reflected from said third concave mirror and reflecting the chief ray causing it to converge toward the optical axis, wherein said first concave mirror, said second mirror, said third concave mirror, said fourth concave mirror, said fifth convex mirror, and said sixth concave mirror are all positioned between the lone conjugate end and the short conjugate end while progressing in a single direction alone the optical axis, whereby the long conjugate end and the short conjugate end are accessible for parallel scanning.

11. An optical reduction system as in claim 10 wherein:

the electromagnetic radiation has a wavelength less than 200 nanometers.

12. An optical reduction system as in claim 11 wherein:

an intermediate image is formed between said third concave mirror and said fourth concave mirror.

13. An optical reduction system as in claim 11 wherein:

an intermediate image is formed between said fifth convex mirror and said sixth concave mirror.

14. An optical reduction system for use in photolithography, from the long conjugate end to the short conjugate end, comprising:

a first concave mirror, a second mirror positioned to receive reflected electromagnetic radiation from said first concave mirror;

a third concave mirror positioned to receive reflected electromagnetic radiation from said second mirror;

a fourth concave mirror positioned to receive reflected electromagnetic radiation from said third concave mirror;

a fifth convex mirror positioned to receive reflected electromagnetic radiation from said fourth concave mirror; and a sixth concave mirror positioned to receive reflected electromagnetic radiation from said fifth convex mirror, said first, second, third, fourth, fifth and sixth mirrors having a radius of curvature on an optical axis, said third concave mirror receiving a chief ray diverging away from the optical axis, said fourth concave mirror receiving the chief ray reflected from said third concave mirror and reflecting the chief ray causing it to converse toward the optical axis;

a first refractive element located between an object and said second mirror;

a second refractive element located near said second mirror; and a third refractive element located between an image and said fifth mirror.

15. An optical reduction system for use in photolithography comprising:

a plurality of curved mirror pairs constructed according to the optical construction data of the following Table 1

TABLE 1

| Element Number | Radius of Curvature | | Thickness | Aperture Diameter | | Glass |
|---|---|---|---|---|---|---|
| | Front | Back | | Front | Back | |
| object | Infinity | | 571.0624 | | | |
| | | | 192.0526 | 236.9146 | | |
| 1 | A(1) | −192.0526 | | 233.4582 | 46.3098 | Refl |
| | | Aperture Stop | 0.0000 | | | |
| 2 | A(2) | 0.0000 | | 45.7172 | 45.2145 | Refl |
| | | | 432.1152 | | | |
| 3 | A(3) | −490.5496 | | 334.0156 | | Refl |
| 4 | A(4) | 490.5496 | | 503.2223 | 240.0123 | Refl |
| | | | −62.8918 | 261.2488 | | |
| | | | 320.6990 | | | |
| 5 | A(5) | −320.6990 | | 86.6738 | | Refl |
| 6 | A(6) | 320.6990 | | 227.7070 | 72.1652 | Refl |
| | Image Distance = | | 22.3092 | | | |
| Image | INF | | | 62.0000 | | | wherein the aspheric constants are given by the following equation and Table 1A $$Z = \frac{(CURV)Y^2}{1 + (1(1+K)(CURV)^2 Y^2)^{1/2}} + (A)Y^4 + (B)Y^6 + (C)Y^8 + (D)Y^{10}$$

TABLE 1A

| Aspheric | Curv | K | A | B | C | D |
|---|---|---|---|---|---|---|
| A(1) | −0.00204178 | 0.000000 | 6.26871E − 10 | −1.09535E − 15 | 1.29067E − 20 | 8.68980E − 26 |
| A(2) | −0.00248086 | 0.000000 | 1.05970E − 08 | 4.81436E − 13 | −1.10750E − 15 | 7.52743E − 19 |
| A(3) | −0.00048280 | 0.000000 | 2.18257E − 11 | 2.87915E − 15 | 6.04832E − 20 | 3.68423E − 25 |
| A(4) | 0.00101457 | 0.000000 | 3.42885E − 11 | −4.85608E − 16 | −3.57675E − 22 | 1.81445E − 26 |
| A(5) | 0.00355137 | 0.000000 | 1.77414E − 08 | 1.15815E − 12 | 7.13212E − 17 | −4.35391E − 21 |
| A(6) | 0.00258825 | 0.000000 | 1.36198E − 10 | 1.22849E − 15 | 8.27928E − 21 | 1.16903E − 25 |

16. An optical reduction system for use in photolithography comprising:

a plurality of curved mirror pairs constructed according to the optical construction data of the following Table 2

TABLE 2

| Element Number | Radius of Curvature | | Thickness | Aperture Diameter | | Glass |
|---|---|---|---|---|---|---|
| | Front | Back | | Front | Back | |
| object | Infinity | | 407.8161 | | | |
| | | | | 357.5906 | | |
| | | | 264.5379 | | | |
| 1 | A(1) | −264.5379 | | 419.5247 | | Refl |
| | | Aperture Stop | 0.0000 | 77.5026 | | |
| 2 | A(2) | 0.0000 | | 74.9379 | | Refl |
| | | | | 77.3224 | | |
| | | | 390.2371 | | | |
| 3 | A(3) | −260.0000 | | 467.2174 | | Refl |
| 4 | A(4) | 260.0000 | | 527.2466 | | Refl |
| | | | | 240.4502 | | |
| | | | −5.6992 | | | |
| | | | | 206.6446 | | |
| | | | 186.2863 | | | |
| 5 | A(5) | −186.2863 | | 92.0895 | | Refl |
| 6 | A(6) | 186.2863 | | 272.0463 | | Refl |
| | | | | 82.3061 | | |
| | Image Distance = | | 20.0000 | | | |
| Image | INF | | | 60.9996 | | | wherein the aspheric constants are given by the following equation and Table 2A $$Z = \frac{(CURV)Y^2}{1 + (1(1+K)(CURV)^2 Y^2)^{1/2}} + (A)Y^4 + (B)Y^6 + (C)Y^8 + (D)Y^{10} +$$

$$(E)Y^{12} + (F)Y^{14} + (G)Y^{16} + (H)Y^{18} + (J)Y^{20}$$

TABLE 2A

| Aspheric | Curv | K<br>E | A<br>F | B<br>G | C<br>H | D<br>J |
|---|---|---|---|---|---|---|
| A(1) | −0.00184131 | 0.000000<br>0.00000E + 00 | 2.24506E − 12<br>0.00000E + 00 | −1.06529E − 15<br>0.00000E + 00 | 1.40153E − 20<br>0.00000E + 00 | −1.45525E − 26<br>0.00000E + 00 |
| A(2) | −0.00344767 | 0.000000<br>3.43046E − 23 | 2.70239E − 08<br>0.00000E + 00 | 6.29102E − 12<br>0.00000E + 00 | 1.39941E − 15<br>0.00000E + 00 | −1.11823E − 19<br>0.00000E + 00 |
| A(3) | −0.00073996 | 0.000000<br>0.00000E + 00 | 3.47651E − 10<br>0.00000E + 00 | 1.86467E − 16<br>0.00000E + 00 | −3.27086E − 20<br>0.00000E + 00 | 1.15234E − 25<br>0.00000E + 00 |
| A(4) | 0.00145483 | 0.000000<br>0.00000E + 00 | −6.10242E − 11<br>0.00000E + 00 | 7.82453E − 16<br>0.00000E + 00 | −8.98158E − 21<br>0.00000E + 00 | −4.15911E − 26<br>0.00000E + 00 |
| A(5) | 0.00444460 | 0.000000<br>6.03283E − 23 | 1.67615E − 07<br>0.00000E + 00 | 1.75232E − 11<br>0.00000E + 00 | 8.40253E − 16<br>0.00000E + 00 | 8.38291E − 20<br>0.00000E + 00 |
| A(6) | 0.00442274 | 0.000000<br>5.15810E − 28 | 5.24492E − 10<br>0.00000E + 00 | 8.43072E − 15<br>0.00000E + 00 | 4.12933E − 19<br>0.00000E + 00 | −9.76520E − 24<br>0.00000E + 00 |

17. An optical reduction system for use in photolithography comprising:
a plurality of curved mirror pairs and refractive elements constructed according to the optical construction data of the following Table 3

TABLE 3

| Element Number | Radius of Curvature | | Thickness | Aperature Diameter | | Glass |
|---|---|---|---|---|---|---|
| | Front | Back | | Front | Back | |
| Object | INF | | 363.7117 | | | |
| 1 | 528.5985 CX | 560.6353 CC | 30.0000<br>20.0000 | 369.2458 | 367.0565 | 'silica' |
| | | | 229.7508 | 364.0844 | | |
| 2 | A(1) | | −209.7508 | 414.3396 | | Refl |
| 3 | −83.4955 CX | −75.5672 CC | −15.0000<br>−11.6150 | 97.0160 | 79.4269 | 'silica' |
| | | | Aperture Stop | 72.1226 | | |
| 4 | A(2) | | 11.6150 | 72.1226 | | Refl |
| 5 | −75.5672 CC | −83.4955 CX | 15.0000<br>407.8622 | 77.0143 | 93.4487 | 'silica' |
| 6 | A(3) | | −635.1022 | 691.6152 | | Refl |
| 7 | A(4) | | 635.1022<br>−62.2903 | 1006.3416<br>131.7841<br>177.7085 | | Refl |
| | | | 134.7903 | | | |
| 8 | A(5) | | −134.7903 | 89.6331 | | Refl |
| 9 | A(6) | | 134.7903 | 223.8931 | | Refl |
| 10 | A(7) | A(8) | 17.5000 | 88.9023 | 73.3478 | 'silica' |
| | Image Distance = | | 10.0000 | | | |
| IMAGE | INF | | | 62.0953 | | | wherein the aspheric constants are given by the following equation and Table 3A $$Z = \frac{(CURV)Y^2}{1 + (1(1 + K)(CURV)^2 Y^2)^{1/2}} + (A)Y^4 + (B)Y^6 + (C)Y^8 + (D)Y^{10} + (E)Y^{12} + (F)Y^{14} + (G)Y^{16} + (H)Y^{18} + (J)Y^{20}$$

TABLE 3A

| Aspheric | Curv | K<br>E | A<br>F | B<br>G | C<br>H | D<br>J |
|---|---|---|---|---|---|---|
| A(1) | −0.00204511 | 0.000000<br>0.00000E + 00 | 2.33031E − 10<br>0.00000E + 00 | −2.45108E − 16<br>0.00000E + 00 | 1.19279E − 20<br>0.00000E + 00 | 7.03022E − 26<br>0.00000E + 00 |
| A(2) | −0.00552141 | 0.000000<br>−2.35686E − 22 | −3.13911E − 09<br>0.00000E + 00 | 5.79100E − 12<br>0.00000E + 00 | −7.42414E − 16<br>0.00000E + 00 | 1.18359E − 18<br>0.00000E + 00 |
| A(3) | −0.00053739 | 0.000000<br>0.00000E + 00 | 1.97475E − 10<br>0.00000E + 00 | −1.92949E − 16<br>0.00000E + 00 | −1.05508E − 21<br>0.00000E + 00 | 3.23255E − 27<br>0.00000E + 00 |
| A(4) | 0.00101984 | 0.000000<br>0.00000E + 00 | −1.51028E − 11<br>0.00000E + 00 | −2.24413E − 18<br>0.00000E + 00 | −3.43794E − 23<br>0.00000E + 00 | −1.20284E − 28<br>0.00000E + 00 |
| A(5) | 0.00387779 | 0.000000<br>2.19063E − 22 | 1.19897E − 07<br>−2.90311E − 26 | 1.63739E − 11<br>0.00000E + 00 | 1.80437E − 15<br>0.00000E + 00 | −5.45296E − 19<br>0.00000E + 00 |
| A(6) | 0.00571450 | 0.000000<br>−1.62403E − 26 | 2.26163E − 09<br>7.29705E − 31 | 8.71431E − 14<br>0.00000E + 00 | 5.66545E − 19<br>0.00000E + 00 | 3.51393E − 22<br>0.00000E + 00 |
| A(7) | 0.00387779 | 0.000000<br>2.19063E − 22 | 1.19897E − 07<br>−2.90311E − 26 | 1.63739E − 11<br>0.00000E + 00 | 1.80437E − 15<br>0.00000E + 00 | −5.46296E − 19<br>0.00000E + 00 |
| A(8) | 0.00280709 | 0.000000<br>0.00000E + 00 | −2.73857E − 08<br>0.00000E + 00 | 3.40519E − 10<br>0.00000E + 00 | −6.15022E − 14<br>0.00000E + 00 | −1.29049E − 17<br>0.00000E + 00 |

18. An optical reduction system having a long conjugate end and a short conjugate end and an optical axis for use in photolithography comprising:

a first concave mirror having a first extended curvature;

a second mirror having a first curvature;

a third concave mirror having a second extended curvature;

a fourth concave mirror having a third extended curvature;

a fifth convex mirror having a second curvature; and a sixth concave mirror having a third curvature, wherein said first concave mirror, said second mirror, said third concave mirror, said fourth concave mirror, said fifth convex mirror, and said sixth concave mirror are all positioned between a first plane formed by the long conjugate end and a second plane formed by the short conjugate end such that when the first and second planes are extended they do not intersect any electromagnetic radiation reflected between said first concave mirror, said second mirror, said third concave mirror, said fourth concave mirror, said fifth convex mirror, and said sixth concave mirror, and the first, second, and third extended curvatures and the first, second, and third curvatures all intersect the optical axis between the first and second planes, whereby the long conjugate end and the short conjugate end are accessible for parallel scanning.

\* \* \* \* \*